(12) United States Patent
Oka et al.

(10) Patent No.: US 8,389,382 B2
(45) Date of Patent: Mar. 5, 2013

(54) METHOD FOR MANUFACTURING BONDED WAFER

(75) Inventors: Satoshi Oka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/130,681

(22) PCT Filed: Oct. 15, 2009

(86) PCT No.: PCT/JP2009/005378
§ 371 (c)(1),
(2), (4) Date: May 23, 2011

(87) PCT Pub. No.: WO2010/073448
PCT Pub. Date: Jul. 1, 2010

(65) Prior Publication Data
US 2011/0237049 A1    Sep. 29, 2011

(30) Foreign Application Priority Data
Dec. 25, 2008 (JP) ................................. 2008-330827

(51) Int. Cl.
*H01L 21/30* (2006.01)
*H01L 21/46* (2006.01)
(52) U.S. Cl. ................. 438/458; 438/459; 257/E21.561
(58) Field of Classification Search ................. 438/455, 438/458, 459; 257/E21.561
See application file for complete search history.

(56) References Cited

U.S. PATENT DOCUMENTS

| 5,508,207 A | 4/1996 | Horai et al. |
| 6,284,629 B1 | 9/2001 | Yokokawa et al. |
| 2004/0056332 A1 | 3/2004 | Bachrach et al. |
| 2010/0130021 A1* | 5/2010 | Ries et al. ..................... 438/748 |

FOREIGN PATENT DOCUMENTS

| DE | 197 53 494 A1 | 10/1998 |
| EP | 0 971 395 A1 | 1/2000 |
| JP | A-06-020896 | 1/1994 |
| JP | A-07-249588 | 9/1995 |

(Continued)

OTHER PUBLICATIONS

Translation of Aug. 18, 2011 International Preliminary Report on Patentability issued in International Application No. PCT/JP2009/005378.
International Search Report issued in Application No. PCT/JP2009/005378; Dated Dec. 28, 2009.

(Continued)

*Primary Examiner* — Thanhha Pham
(74) *Attorney, Agent, or Firm* — Oliff & Berridge, PLC

(57) ABSTRACT

A method for manufacturing a bonded wafer including the steps of: implanting at least one gas ion of a hydrogen ion and a rare gas ion into a bond wafer from a surface thereof to form an ion-implanted layer; bonding the ion-implanted surface of the bond wafer to a surface of a base wafer directly or through an oxide film; thereafter delaminating the bond wafer at the ion-implanted layer to prepare the bonded wafer having a silicon thin film formed on the base wafer; and performing a flattening heat treatment on the bonded wafer under an atmosphere containing hydrogen or hydrogen chloride, wherein a dopant gas is added into the atmosphere of the flattening heat treatment to perform the heat treatment, the dopant gas having the same conductivity type as a dopant contained in the silicon thin film.

17 Claims, 3 Drawing Sheets

FOREIGN PATENT DOCUMENTS

| | | |
|---|---|---|
| JP | A-10-144698 | 5/1998 |
| JP | A-2000-030995 | 1/2000 |
| JP | A 2002-184781 | 6/2002 |
| JP | A 2002-217204 | 8/2002 |
| JP | A-2005-539259 | 12/2005 |

OTHER PUBLICATIONS

Extended European Search Report dated Jun. 28, 2012 in Application No. 09834265.2.

* cited by examiner

METHOD FOR MANUFACTURING BONDED WAFER

TECHNICAL FIELD

The present invention relates to a method for manufacturing a bonded wafer having a silicon thin film by using an ion implantation delamination method.

BACKGROUND ART

As a method for manufacturing a bonded wafer, there are commonly known an ion implantation delamination method (also called as the Smart Cut method (registered trademark)) and a method in which two wafers are bonded and thereafter one of the wafers is thinned by grinding and polishing.

First, the method using grinding and polishing is performed as follows. Two silicon wafers are bonded directly or through an oxide film without using an adhesive, bonding strength is enhanced by a heat treatment (1000 to 1200° C.), and one of the wafers is thereafter thinned by grinding and polishing. The advantage of this method is that the crystallinity of the thinned silicon and the reliability of the buried oxide film are equal to those of a normal silicon wafer. The disadvantage thereof is that the thinned silicon has film thickness uniformity limitations (at most appropriately ±0.3 µm) and that material costs are high because two silicon wafers are used to manufacture one bonded wafer.

On the other hand, the ion implantation delamination method is performed as follows. After at least one gas ion of a hydrogen ion and a rare gas ion is implanted into a main surface of at least one wafer (a bond wafer) of two silicon wafers to form an ion-implanted layer (a delamination layer) inside the wafer, the ion-implanted surface is brought into close contact with a main surface of the other silicon single crystal wafer (a base wafer) directly or through an oxide film. A heat treatment at 500° C. or more is thereafter performed to delaminate. This method has the advantage that the bonded wafer having a silicon thin film with a film thickness uniformity of ±10 nm or less can be readily manufactured and that material costs can be reduced by reusing the delaminated bond wafer more than once.

Incidentally, in case of bonding through the oxide film, a thick-film SOI wafer having an SOI layer (the silicon thin film) with a film thickness of several to several tens of micrometers is a highly useful wafer for use in bipolar devices and power devices. However, there is known that manufacturing a high quality SOI wafer at low cost is relatively difficult even when the above-described ion-implantation delamination method or the method using grinding and polishing is used.

The reason for that is as follows. In the case of the method of thinning the bond wafer by grinding and polishing, it is necessary to bond a wafer having an oxide film to a bare wafer, to perform a bonding heat treatment at 1100° C. or more, and to perform grinding and polishing processing so as to obtain a desired SOI layer thickness. Processes are thus complicated, and it is extremely difficult to improve the SOI film thickness uniformity. On the other hand, in the case of the ion implantation delamination method, the SOI layer thickness is determined by the depth to which ions can be implanted (that is, accelerating voltage of an ion implanter). When a common implanter is used, the maximum accelerating voltage is approximately 200 keV, and only the SOT layer having at most a thickness of approximately 2 µm is obtained. The thick-film SOI layer having a thickness of more than 2 µm cannot be therefore obtained by this method.

As a method for obtaining the above-described thick-film SOI wafer having a thick SOI layer, there is known a method of making the SOI layer thicker by growing an epitaxial layer on the SOI layer of the SOI wafer obtained by the above-described ion implantation delamination method. However, the surface of the SOI layer, just after delamination, obtained by the ion implantation delamination method has a high degree of roughness (P-V value: nearly 50 nm). When the epitaxial layer is grown on such a surface, the epitaxial layer becomes inferior in a roughness and particle level, and therefore some measures have to be taken against this problem.

In view of this, an attempt to improve the roughness only by polishing makes the film thickness uniformity obtained by the ion implantation delamination method worse. Moreover, Patent Literature 1 discloses that the SOI wafer is subjected to a heat treatment under a reducing atmosphere containing hydrogen or an atmosphere containing a hydrogen chloride gas and the epitaxial growth is thereafter performed.

However, the SOI layer disadvantageously has an unexpected dopant concentration profile depending on the conditions of this heat treatment, and the unexpected profile affects electrical characteristics of devices. In general, the silicon thin films of bonded wafers manufactured by the ion implantation delamination method have the same disadvantage as above.

CITATION LIST

Patent Literature
Patent Literature 1:Japanese Unexamined Patent publication (Kokai) No.2000-30995

SUMMARY OF INVENTION

The present invention was accomplished in view of the above-explained problems, and its object is to provide a method for manufacturing a bonded wafer that enables a flattening heat treatment to be performed while a change in dopant concentration in the silicon thin film of the bonded wafer obtained by the ion implantation delamination method is suppressed.

To achieve this object, the present invention provides a method for manufacturing a bonded wafer including the steps of: implanting at least one gas ion of a hydrogen ion and a rare gas ion into a bond wafer from a surface thereof to form an ion-implanted layer; bonding the ion-implanted surface of the bond wafer to a surface of a base wafer directly or through an oxide film; thereafter delaminating the bond wafer at the ion-implanted layer to prepare the bonded wafer having a silicon thin film formed on the base wafer; and performing a flattening heat treatment on the bonded wafer under an atmosphere containing hydrogen or hydrogen chloride, wherein a dopant gas is added into the atmosphere of the flattening heat treatment to perform the heat treatment, the dopant gas having the same conductivity type as a dopant contained in the silicon thin film.

In this manner, when the dopant gas is added into the atmosphere of the flattening heat treatment to perform the heat treatment, the dopant gas having the same conductivity type as the dopant contained in the silicon thin film, the outward diffusion of the dopant contained in the silicon thin film can be suppressed during the heat treatment. In addition, when the flattening heat treatment is performed under the atmosphere containing hydrogen or hydrogen chloride, surface roughness can be improved while high film thickness uniformity of the silicon thin film obtained by the ion implantation delamination method is maintained.

As described above, the bonded wafer having a flat silicon thin film with a desired dopant concentration and high film thickness uniformity can be efficiently manufactured by the manufacturing method according to the present invention.

In this case, the concentration of the dopant contained in the silicon thin film is preferably $1\times10^{18}/\text{cm}^3$ or more.

When a relatively high concentration dopant is contained in the silicon thin film as above, the manufacturing method according to the present invention, which can suppress the change in dopant concentration is particularly preferably used.

In this case, a gas containing $B_2H_6$ or $BCl_3$ can be added as the dopant gas in case of the silicon thin film of p-type, and a gas containing $PH_3$ can be added as the dopant gas in case of the silicon thin film of n-type.

In this manner, the dopant gas added at the time of performing the flattening heat treatment in the manufacturing method according to the present invention can be appropriately selected.

In this case, a silicon epitaxial layer is preferably grown on the silicon thin film of the bonded wafer subjected to the flattening heat treatment.

In this manner, the surface of the silicon thin film of the bonded wafer subjected to the flattening heat treatment according to the present invention is made to be flat with high film thickness uniformity and a desired dopant concentration maintained, and an epitaxial layer having high flatness and few defects can be thereby grown on the surface thereof. Further, a designed dopant concentration can be obtained, and the bonded wafer having a thick-film silicon layer with high quality can be manufactured.

In this case, it is preferable that the flattening heat treatment and the growth of the silicon epitaxial layer are successively performed in an identical reactor.

When the epitaxial layer having the same conductivity type as the silicon thin film is formed, the thick-film bonded wafer can be more efficiently manufactured by successively performing the flattening heat treatment and the growth of the silicon epitaxial layer in the identical reactor.

In this case, it is preferable that the flattening heat treatment and the growth of the silicon epitaxial layer are each performed in a separate reactor.

When the epitaxial layer having the different conductivity type from that of the silicon thin film is formed, the incorporation of impurities other than an intended dopant into the silicon epitaxial layer can be more surely avoided by taking the wafer out of the reactor after the flattening heat treatment and performing the epitaxial growth in another reactor, and the bonded wafer having a thick-film silicon layer with higher quality can be manufactured.

As described above, with the method for manufacturing a bonded wafer according to the present invention, the bonded wafer can be flattened with high film thickness uniformity while a desired dopant concentration of the silicon thin film can be maintained, and the bonded wafer can be manufactured which is suitable for the formation of the thick-film silicon layer by growing the epitaxial layer.

DESCRIPTION OF EMBODIMENTS

Conventionally, there is a problem that the dopant concentration of the silicon thin film changes due to the flattening heat treatment in the manufacture of the bonded wafer.

The present inventors repeatedly keenly conducted studies on the above-described problem. As a result, the present inventors found the following.

Figure 2:
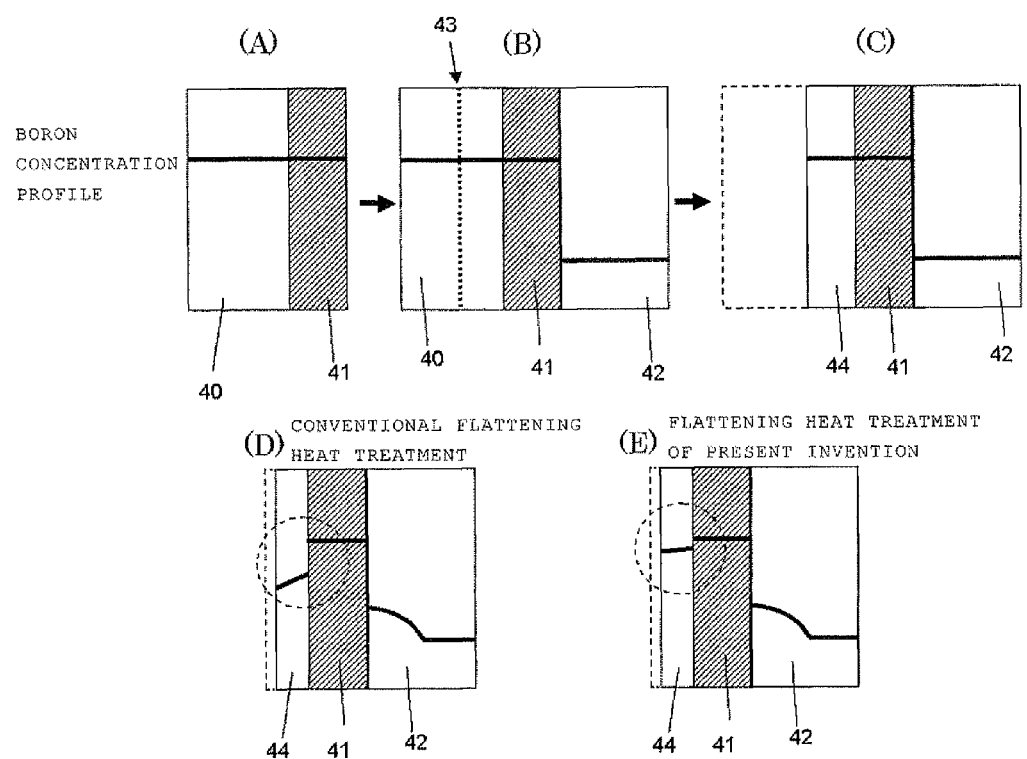
FIGS. 2 are schematic views showing the concentration profiles of the dopant contained in the wafer, during the manufacture of the bonded wafer.

FIGS. 2 are schematic views showing the concentration profiles of the dopant contained in the wafer, during the manufacture of the bonded wafer.

As shown in FIG. 2(A), a substrate containing a high concentration of boron is used as the bond wafer 40 to perform a heat treatment for forming an oxide film. The dopant (boron) of the bond wafer 40 is taken in the oxide film 41, and the boron concentration in the oxide film 41 increases to the same level as the high-concentration substrate (the bond wafer) 40.

Next, as shown in FIG. 2(B), ions are implanted into the bond wafer 40 having the oxide film 41 formed thereon to form the ion-implanted layer 43, and the bond wafer is thereafter bonded to the base wafer 42. Since the bonding is performed at room temperature, the concentration distribution of boron does not change at this point.

Next, as shown in FIG. 2(C), the bond wafer 40 is delaminated to form an SOI layer 44. In this point, since the delamination heat treatment is performed at a relatively low temperature, the boron concentration profile hardly changes.

Next, as shown in FIG. 2(D), in the event that the flattening heat treatment is performed under a hydrogen atmosphere or a hydrogen chloride atmosphere at a high temperature according to a conventional method in order to improve the roughness of the surface of the SOI layer 44 after the delamination, a temperature of 1000° C. or more is required for the flattening heat treatment, the boron contained in the SOI layer 44 is therefore diffused outward, and the concentration profile consequently changes.

On the other hand, as shown in FIG. 2(E), the present inventors found that when the flattening heat treatment is performed under an atmosphere in which the dopant gas containing boron is added into a hydrogen or hydrogen chloride atmosphere at a high temperature in order to improve the roughness of the surface of the SOI layer 44 after the delamination, the outward diffusion of the boron contained in the SOI layer 44 can be suppressed, and the change in dopant concentration can be prevented to the utmost. The present inventors thereby brought the present invention to completion.

Hereinafter, an example of the embodiments of the method for manufacturing a bonded wafer according to the present invention will be explained in detail with reference to the drawings. However, the present invention is not restricted thereto.

Figure 1:
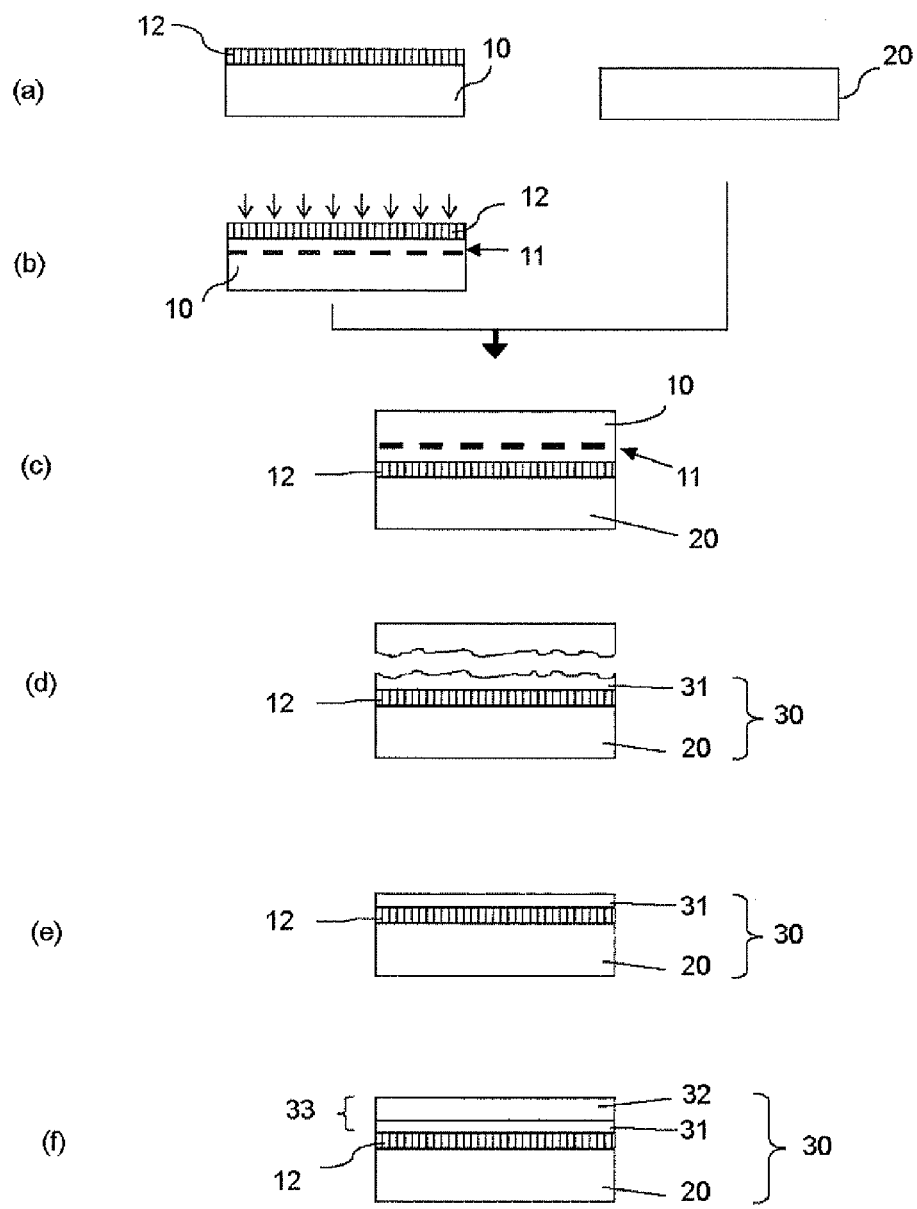
FIG. 1 is a flow chart showing an example of the embodiments of the manufacturing method according to the present invention.

FIG. 1 is a flow chart showing an example of the embodiment of the method for manufacturing a bonded wafer according to the present invention.

First, as shown in FIG. 1(a), for example a substrate containing a high concentration of boron and a substrate containing a low concentration of boron are prepared as the bond wafer 10 and the base wafer 20, respectively. In this case, the oxide film 12 is formed only on the bond wafer 10 in FIG. 1. The oxide film may be formed only on the base wafer 20, it may be formed on both of the wafers, or it may be formed on neither of the wafers.

Next, as shown in FIG. 1(b), at least one gas ion of a hydrogen gas ion and a rare gas ion is implanted into the bond wafer 10 from the surface thereof to form the ion-implanted layer 11.

Next, as shown in FIG. 1(c), the ion-implanted surface of the bond wafer 10 is bonded to the surface of the base wafer 20 through the oxide film 12. Here, in the event that the oxide film is not formed, they can be bonded directly.

Next, as shown in FIG. 1(d), the bond wafer 10 is delaminated at the ion-implanted layer 11 to prepare the bonded wafer 30 having the silicon thin film (the SOI layer) 31 formed on the base wafer 20. The delamination method is not restricted in particular. For example, when a delamination heat treatment is performed at a temperature of approximately 500° C. or more under an inert gas atmosphere, the bond wafer is delaminated at the ion-implanted layer due to the rearrangement of crystal and the cohesion of bubbles.

In this case, the concentration of the dopant contained in the silicon thin film 31 is preferably $1\times10^{18}/cm^3$ or more.

When a relatively high concentration dopant is contained in the silicon thin film as above, the manufacturing method according to the present invention, which can suppress the change in dopant concentration, is particularly preferably used. When the concentration of the dopant contained in the bond wafer that is prepared in the previous process is equal to or more than the above-described value, the dopant concentration in a state of the silicon thin film after the delamination becomes almost the above-described value or more.

Next, since the surface of the silicon thin film just after the delamination is rough, the flattening heat treatment is performed under an atmosphere containing hydrogen or hydrogen chloride as shown in FIG. 1(e). In this point, the dopant gas having the same conductivity type as the dopant contained in the silicon thin film 31 is added into the atmosphere of the flattening heat treatment to perform the heat treatment, in the present invention.

As described above, when the flattening heat treatment is performed under the atmosphere containing hydrogen or hydrogen chloride on the surface of the silicon thin film roughened due to the delamination in the previous process, the surface roughness can be improved by the influence of etching and migration of silicon atoms, while high film thickness uniformity of the silicon thin film obtained by the ion implantation delamination method is maintained. Moreover, when the dopant gas having the same conductivity type as the dopant contained in the silicon thin film is added into the atmosphere of the flattening heat treatment to perform the heat treatment, the outward diffusion of the dopant contained in the silicon thin film can be suppressed during the high temperature heat treatment, and the change in dopant concentration in the silicon thin film can be thereby prevented.

In this case, a gas containing $B_2H_6$ or $BCl_3$ can be added as the dopant gas in case of the silicon thin film 31 of p-type (the dopant is boron or the like), and a gas containing $PH_3$ can be added as the dopant gas in case of the silicon thin film 31 of n-type (the dopant is phosphorus, antimony, arsenic, or the like).

As described above, the dopant gas to be added at the flattening heat treatment in the manufacturing method of the present invention can be appropriately selected.

The temperature of the flattening heat treatment is not restricted in particular. For example, when the temperature is 1000° C. or more, the silicon thin film can be sufficiently flattened, and the bonding strength of the bonded surfaces can be enhanced at the same time. This is therefore preferable.

Moreover, the surface of the silicon thin film can be more flattened by CMP (Chemical Mechanical Polishing) after the flattening heat treatment. In this case, since the surface is flattened to a certain extent by the flattening heat treatment in the previous process, it is therefore flattened at a small amount of polishing stock removal sufficiently, and the film thickness uniformity is not so much deteriorated by the polishing.

Next, as shown in FIG. 1(f), the silicon epitaxial layer 32 is preferably grown on the silicon thin film 31 of the bonded wafer 30 subjected to the flattening heat treatment to obtain the thick-film SOI layer 33.

As described above, the surface of the silicon thin film of the bonded wafer subjected to the flattening heat treatment according to the present invention is made to be flat with high film thickness uniformity and a desired dopant concentration maintained, and the epitaxial layer having few defects can be thereby grown thereon. Further, a designed dopant concentration can be obtained, and the bonded wafer having a thick-film silicon layer with high quality can be manufactured.

In this point, when the silicon epitaxial layer 32 has the same conductivity type as the silicon thin film 31, it is preferable that the flattening heat treatment and the growth of the silicon epitaxial layer are successively performed in the identical reactor. Moreover, when the silicon epitaxial layer 32 has the different conductivity type from that of the silicon thin film 31, it is preferable that the flattening heat treatment and the growth of the silicon epitaxial layer are each performed in the separate reactor.

Performing them successively in the identical reactor enables more efficient manufacture. In the case of the different conductivity type, use of the separate reactor reduces concern about the compensation due to, for example, contamination of impurity of the different conductivity type. As a result, the bonded wafer with higher quality can be manufactured.

As described above, with the method for manufacturing a bonded wafer according to the present invention, the silicon thin film of the bonded wafer can be flattened with high film thickness uniformity while a desired dopant concentration can be maintained, the thick-film silicon layer can be formed by growing a high quality epitaxial layer thereon with high flatness and few defects, and therefore the present invention is favorable for the manufacture of the thick-film SOI wafer.

Hereinafter, the present invention will be explained in more detail based on Example and Comparative Example, but the present invention is not restricted thereto.

EXAMPLE, AND COMPARATIVE EXAMPLE

Silicon single crystal wafers (B concentration: $5\times10^{18}/cm^3$) having a diameter of 300 mm and a crystal orientation of <100> were prepared as the bond wafer and the base wafer. A silicon oxide film of 150 nm was formed on the surface of the bond wafer, and thereafter $H^+$ ions were implanted through the silicon oxide film (50 keV, $5\times10^{16}/cm^2$). The bond wafer was bonded to the base wafer at room temperature and thereafter delaminated at a delamination temperature of 500° C. The SOI wafer was thereby manufactured.

With a single-wafer-processing epitaxial apparatus, the delaminated SOI wafer was subjected to the flattening heat treatment in conditions as described below.
1. pressure:normal pressure (1013 hPa (760 torr))
2. temperature: 1050° C.
3. $H_2$: 80 slm, HCL: 400 sccm, $B_2H_6$(100 ppm):150 sccm (added (Example), not added (Comparative Example))
4. time: 10 minutes Thereafter, the silicon epitaxial layer of 3 μm was grown on the SOI layer in conditions as described below successively without taking the wafer out of a furnace, and the thick-film SOI wafer was thereby manufactured.

Figure 3:
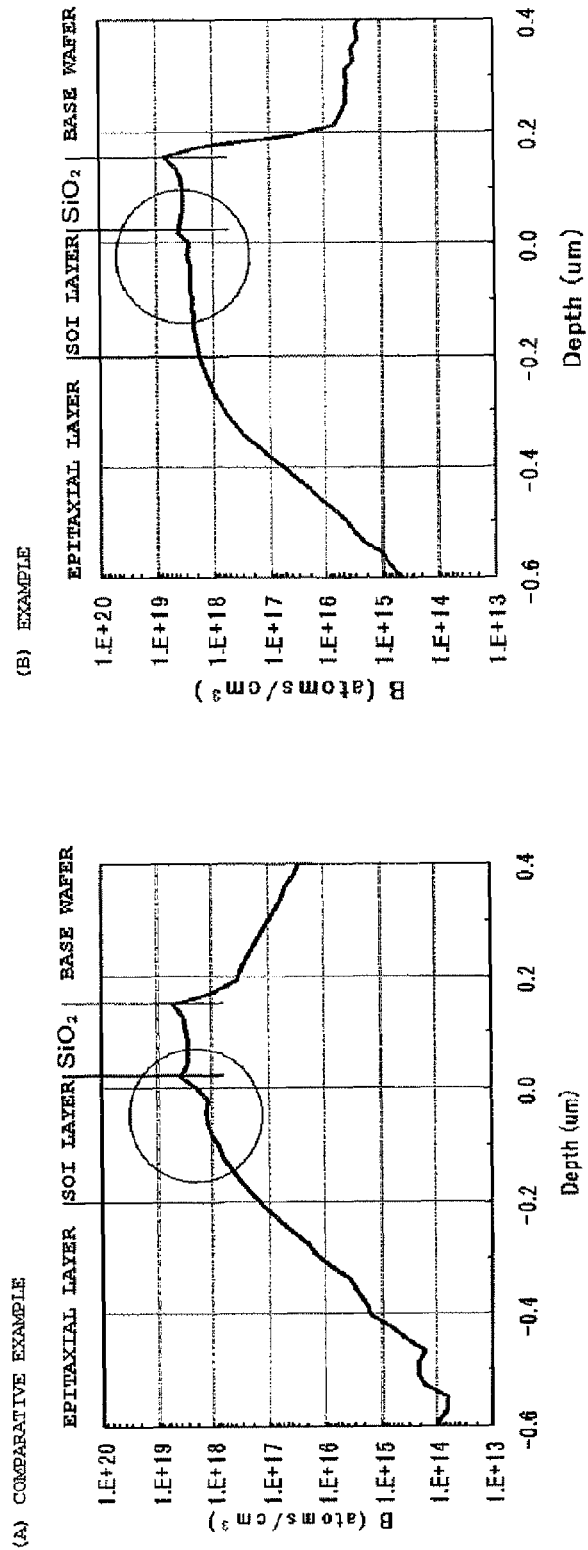
FIGS. 3 are graphs showing concentration distribution of each dopant contained in the wafers manufactured in Example and Comparative Example.

1. pressure: reduced pressure (107 hPa (80 torr))
2. temperature: 1080° C.
3. $H_2$: 40 slm, $SiH_2Cl_2$: 450 sccm FIG. 3 shows the measurement result of boron concentration profile, which was obtained by SIMS (Secondary Ion Mass Spectroscopy), in the vicinity of a buried oxide film (BOX) of the thick-film SOI wafer obtained by the above-described processes. FIG. 3(A) shows the case (Comparative Example) where the dopant gas ($B_2H_6$) was not added in the heat treatment under an atmosphere containing a hydrogen chloride gas. FIG. 3(B) shows the case (Example) where the dopant gas ($B_2H_6$) was added.

It was revealed that the B concentration of the SOI layer before the epitaxial growth decreased due to the outward diffusion, in the case where the dopant gas was not added. On the other hand, the outward diffusion in the case where the dopant gas was added was more suppressed in comparison with the case where the dopant gas was not added, and approximately the initial boron concentration was maintained. As the heat treatment temperature is higher and the process time is longer, the decrease in concentration due to the outward diffusion becomes more conspicuous, and thus the dopant concentration of the SOI layer may become highly different from that of the used substrate according to the heat treatment conditions. The outward diffusion of the dopant contained in the SOI layer can be suppressed by introducing the dopant gas during the heat treatment, and the margin of each heat treatment condition is thereby improved, and the thick-film SOI wafer having a designed dopant concentration profile can be consequently manufactured.

It is to be noted that the B concentration of the epitaxial layer gradually decreased because the doping with boron was not performed in the silicon epitaxial growth.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer including the steps of:
   implanting at least one gas ion of a hydrogen ion and a rare gas ion into a bond wafer from a surface thereof to form an ion-implanted layer;
   bonding the ion-implanted surface of the bond wafer to a surface of a base wafer directly or through an oxide film; thereafter
   delaminating the bond wafer at the ion-implanted layer to prepare the bonded wafer having a silicon thin film formed on the base wafer; and
   performing a flattening heat treatment on the bonded wafer under an atmosphere containing hydrogen or hydrogen chloride, wherein
   a dopant gas is added into the atmosphere of the flattening heat treatment to perform the heat treatment, the dopant gas having the same conductivity type as a dopant contained in the silicon thin film.

2. The method for manufacturing a bonded wafer according to claim 1, wherein a concentration of the dopant contained in the silicon thin film is $1 \times 10^{18}$/cm$^3$ or more.

3. The method for manufacturing a bonded wafer according to claim 1, wherein a gas containing $B_2H_6$ or $BCl_3$ is added as the dopant gas in case of the silicon thin film of p-type, and a gas containing $PH_3$ is added as the dopant gas in case of the silicon thin film of n-type.

4. The method for manufacturing a bonded wafer according to claim 2, wherein a gas containing $B_2H_6$ or $BCl_3$ is added as the dopant gas in case of the silicon thin film of p-type, and a gas containing $PH_3$ is added as the dopant gas in case of the silicon thin film of n-type.

5. The method for manufacturing a bonded wafer according to claim 1, wherein a silicon epitaxial layer is grown on the silicon thin film of the bonded wafer subjected to the flattening heat treatment.

6. The method for manufacturing a bonded wafer according to claim 2, wherein a silicon epitaxial layer is grown on the silicon thin film of the bonded wafer subjected to the flattening heat treatment.

7. The method for manufacturing a bonded wafer according to claim 3, wherein a silicon epitaxial layer is grown on the silicon thin film of the bonded wafer subjected to the flattening heat treatment.

8. The method for manufacturing a bonded wafer according to claim 4, wherein a silicon epitaxial layer is grown on the silicon thin film of the bonded wafer subjected to the flattening heat treatment.

9. The method for manufacturing a bonded wafer according to claim 5, wherein the flattening heat treatment and the growth of the silicon epitaxial layer are successively performed in an identical reactor.

10. The method for manufacturing a bonded wafer according to claim 6, wherein the flattening heat treatment and the growth of the silicon epitaxial layer are successively performed in an identical reactor.

11. The method for manufacturing a bonded wafer according to claim 7, wherein the flattening heat treatment and the growth of the silicon epitaxial layer are successively performed in an identical reactor.

12. The method for manufacturing a bonded wafer according to claim 8, wherein the flattening heat treatment and the growth of the silicon epitaxial layer are each performed in a separate reactor.

13. The method for manufacturing a bonded wafer according to claim 5, wherein the flattening heat treatment and the growth of the silicon epitaxial layer are each performed in a separate reactor.

14. The method for manufacturing a bonded wafer according to claim 6, wherein the flattening heat treatment and the growth of the silicon epitaxial layer are each performed in a separate reactor.

15. The method for manufacturing a bonded wafer according to claim 7, wherein the flattening heat treatment and the growth of the silicon epitaxial layer are each performed in a separate reactor.

16. The method for manufacturing a bonded wafer according to claim 8, wherein the flattening heat treatment and the growth of the silicon epitaxial layer are each performed in a separate reactor.

17. The method for manufacturing a bonded wafer according to claim 1, wherein a temperature of the flattening heat treatment is between 1000 and 1050° C.

* * * * *